US009605821B2

United States Patent
Al-Gaadi et al.

(10) Patent No.: US 9,605,821 B2
(45) Date of Patent: Mar. 28, 2017

(54) OUTDOOR LED LUMINAIRE WITH PLASTIC HOUSING

(71) Applicant: GE LIGHTING SOLUTIONS, LLC, East Cleveland, OH (US)

(72) Inventors: Bidour Al-Gaadi, Budapest (HU); Xavier Jacques Denis, Budapest (HU); Zoltán Hercz, Budapest (HU); Balázs Nagy, Budapest (HU)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 163 days.

(21) Appl. No.: 14/547,652

(22) Filed: Nov. 19, 2014

(65) Prior Publication Data
US 2016/0138791 A1 May 19, 2016

(51) Int. Cl.
| | | |
|---|---|---|
| *F21S 8/08* | (2006.01) | |
| *H05K 1/02* | (2006.01) | |
| *F21V 15/01* | (2006.01) | |
| *F21V 29/87* | (2015.01) | |
| *F21Y 105/10* | (2016.01) | |
| *F21Y 115/10* | (2016.01) | |

(52) U.S. Cl.
CPC .............. *F21S 8/086* (2013.01); *F21V 15/01* (2013.01); *F21V 29/87* (2015.01); *H05K 1/0209* (2013.01); *F21Y 2105/10* (2016.08); *F21Y 2115/10* (2016.08); *H05K 2201/09781* (2013.01); *H05K 2201/10106* (2013.01)

(58) Field of Classification Search
CPC ...... F21V 29/508; F21V 29/507; F21V 29/70; F21V 29/85; F21V 23/005; F21V 23/06; H05K 1/0209
See application file for complete search history.

(56) References Cited

U.S. PATENT DOCUMENTS

| 8,410,672 B2 | 4/2013 | Rebergen | |
|---|---|---|---|
| 2009/0213595 A1* | 8/2009 | Alexander | ............ F21V 19/001 362/373 |

(Continued)

FOREIGN PATENT DOCUMENTS

WO    03036158 A1    5/2003

OTHER PUBLICATIONS

PCT Search Report and Written Opinion issued in connection with corresponding PCT Application No. PCT/US2015/050537 on Jan. 15, 2016.

(Continued)

*Primary Examiner* — Mary Ellen Bowman
(74) *Attorney, Agent, or Firm* — GE Global Patent Operation; Peter T. DiMauro

(57) ABSTRACT

An outdoor light emitting diode (LED) luminaire includes a plastic housing having two or more surfaces, a printed circuit board (PCB) coupled to at least one of the two or more surfaces, the PCB including a substrate and a conductive surface on the substrate, a plurality of LED light sources mounted on the PCB, a first portion of the conductive surface forming conductive paths in electrical communication with the plurality of LED light sources, and a second portion of the conductive surface forming thermal pads at a plurality of locations that are at least one of between and around the plurality of LED light sources, the thermal pads configured to dissipate heat generated by the plurality of LED light sources.

15 Claims, 2 Drawing Sheets

(56) References Cited

U.S. PATENT DOCUMENTS

2011/0068672 A1 3/2011 Hasnain
2012/0113630 A1 5/2012 Huo

OTHER PUBLICATIONS

"DiamondInsideTM LED with Supersonic Heat Spreading and Black Body Radiation", Authors: James C. Sung, Kevin Kan, Andy Lin, Eric Tsai, Sam Huang, Michael Sung, Leo Lee; Found at http://www.ritedia.com/eng/download/technology/pdf on Nov. 9, 2014.

* cited by examiner

OUTDOOR LED LUMINAIRE WITH PLASTIC HOUSING

BACKGROUND

The housings for traditional outdoor luminaires are typically made from aluminum by a die casting process. The die casting process can have high material and tooling costs. Outdoor luminaires with light emitting diode (LED) light sources usually have the LED light sources located on a printed circuit board (PCB) located within the die cast housing.

The PCB to which the LED light sources are mounted is typically smaller than the interior of the housing, which places individual LED light sources in close proximity to one another. The density of this LED light source arrangement requires the use of high thermal conductivity material (copper, aluminum, etc.) as a heat sink to draw heat away from the PCB and the LED light sources. A thermal interface material, for example grease, could be applied between the PCB and the heat sink to improve thermal contact. These traditional LED outdoor luminaires often have an optical unit (e.g., lens, reflector, shield, cover, etc.) located over the multiple LED light sources of the luminaire.

Conventional LED luminaires having plastic housings typically are not produced for outdoor luminaire applications. Some LED luminaires with plastic housings are made with a thermally conductive plastic, or use a heat sink located between the LED light source PCB and the housing so that the PCB is not in direct thermal contact with the plastic housing.

DETAILED DESCRIPTION

Figure 1:
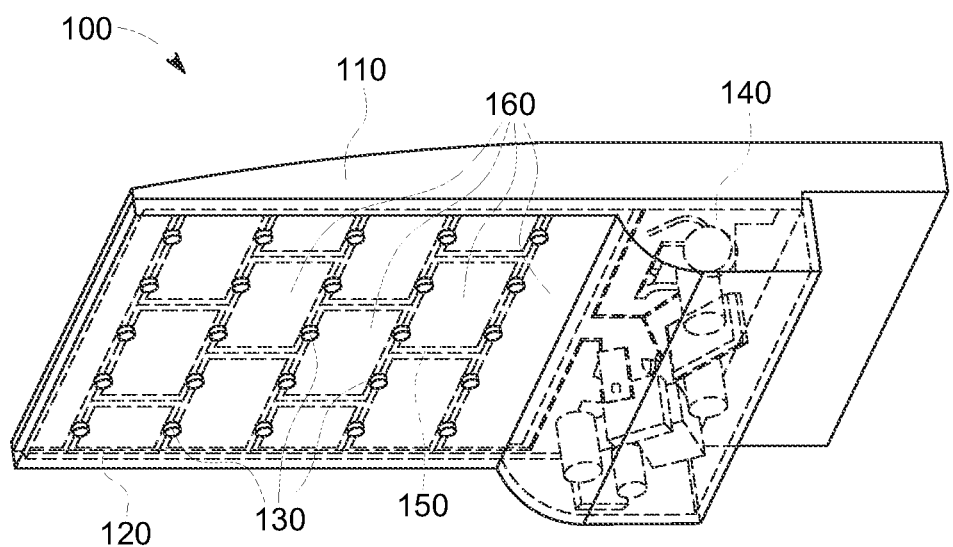
FIG. 1 depicts a perspective view of an outdoor LED luminaire in accordance with some embodiments.

Systems and method in accordance with embodiments provide a low cost outdoor LED luminaire that includes a housing comprised of plastic material, and an LED PCB coupled and/or connected to the housing, either directly or via a thermal interface material. This LED PCB is in thermal contact with the housing.

In accordance with embodiments, the housing may be comprised of plastic material free of enhanced thermal conductivity properties, (e.g., technical plastics such as ABS, PC, PA6.6 reinforced by glass fiber, carbon fiber, etc.). In other implementations the housing may be comprised of a plastic material having enhanced thermal conductivity properties (e.g., about >0.5 W/m-K).

By way of example, without being an exhaustive list, the housing can be formed from a wide variety of thermoplastic resins, blend of thermoplastic resins, thermosetting resins, or blends of thermoplastic resins with thermosetting resins, as well as combinations comprising at least one of the foregoing. The plastic may also be a blend of polymers, copolymers, terpolymers, or combinations comprising at least one of the foregoing. The plastic can also be an oligomer, a homopolymer, a copolymer, a block copolymer, an alternating block copolymer, a random polymer, a random copolymer, a random block copolymer, a graft copolymer, a star block copolymer, a dendrimer, or the like, or a combination comprising at least one of the foregoing. Examples include polyacetals, polyolefins, polyacrylics, poly(arylene ether) polycarbonates, polystyrenes, polyesters (e.g., cycloaliphatic polyester, high molecular weight polymeric glycol terephthalates or isophthalates, and so forth), polyamides (e.g., semi-aromatic polyamid such as PA4.T, PA6.T, PA9.T, and so forth), polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, styrene acrylonitrile, acrylonitrile-butadiene-styrene (ABS), polyethylene terephthalate (PET), polybutylene terephthalate (PBT), polyurethane (PUR), ethylene propylene diene rubber (EPR), polytetrafluoroethylene (PTFE), fluorinated ethylene propylene, perfluoroalkoxyethylene, polychlorotrifluoroethylene, polyvinylidene fluoride, or the like, or a combination comprising at least one of the foregoing organic polymers. Examples of polyolefins include polyethylene (PE), including high-density polyethylene (HDPE), linear low-density polyethylene (LLDPE), low-density polyethylene (LDPE), mid-density polyethylene (MDPE), glycidyl methacrylate modified polyethylene, maleic anhydride functionalized polyethylene, maleic anhydride functionalized elastomeric ethylene copolymers, ethylene-butene copolymers, ethylene-octene copolymers, ethylene-acrylate copolymers, such as ethylene-methyl acrylate, ethylene-ethyl acrylate, and ethylene butyl acrylate copolymers, glycidyl methacrylate functionalized ethylene-acrylate terpolymers, anhydride functionalized ethylene-acrylate polymers, anhydride functionalized ethylene-octene and anhydride functionalized ethylene-butene copolymers, polypropylene (PP), maleic anhydride functionalized polypropylene, glycidyl methacrylate modified polypropylene, and a combination comprising at least one of the foregoing.

The use of plastic material free of enhanced thermal conductivity properties offers an approach with lower material and processing costs. Embodying outdoor LED luminaires can be used for, but not limited to, high-power, high-illumination applications where the luminous flux of the luminaire is over 1000 lumens such as street lighting, area illumination, parking light, flood light, architectural lighting, sports lighting, etc.

In accordance with embodiments, an outdoor LED luminaire can include a housing made of conventional plastics or technical plastics, and a LED PCB mounted directly to the housing. By utilizing plastic material for the housing of a high-power output luminaire, lower manufacturing and/or production costs along with lighter weight and electrical insulation can be achieved.

Conventional LED luminaires with plastic housings are problematic in that the plastic housing acts as a thermal insulator resulting in a build-up of heat within the housing. This heat build-up has a negative effect on long term LED reliability and lumen depreciation because of the already high junction temperature of LEDs. Conventional LED luminaires with plastic housings increases the temperature rise of operating LEDs compared to a metal housing.

FIG. 1 depicts a perspective view of outdoor LED luminaire 100 in accordance with embodiments. Luminaire 100 includes housing 110 and PCB 120. In accordance with embodiments, the housing may be comprised of plastic material free of enhanced thermal conductivity properties. In accordance with implementations, the LED PCB can be mounted on an exterior surface of the housing, or positioned in, or in proximity to, an interior of the housing. The PCB can be a substrate with electrically conductive material on at least one surface. On one side of the PCB are mounted multiple LED light sources 130. This surface of the PCB also has conductive paths or artwork traces 150, which are formed by etching away conductive material from the PCB surface. Disposed on this surface of the PCB are thermal pads 160 located between and/or around the LED light sources. Thermal pads 160 are also etched from the PCB's conductive layer. In some implementations the thermal pads are electrically isolated from the conductive traces. In other implementations the thermal pads and the conductive traces can be in electrical connection. Luminaire 100 also can include LED drive circuitry 140. The LED drive circuitry provides electrical power to the LED light sources along the conductive artwork paths.

In accordance with Fourier's Law of Heat Conduction, minimizing the heat flux generated by the multiple LED light sources 130 can result in lowering the temperature gradient and hence the temperature drop between LED light sources 130 and their surrounding environment (e.g., as measured from a solder junction to the ambient, the maximum temperature drop should be less than about 80° C.). To achieve a low heat flux, LED light sources 130 are distributed on the PCB. The LED light sources are distributed (i.e., spaced apart) over a surface area of the PCB based on thermal considerations of using the thermal pads as heat sinks to dissipate the heat generated by the LED light sources. This PCB also includes a highly conductive thermal layer from which thermal pads are etched to spread the heat. Spacing apart the LED light sources reduces the heat flux generated by the LED light sources, and also reduces the visual glare produced by the luminaire. In accordance with some embodiments a minimum thermal pad surface area per LED can be calculated by Equation 1:

$$A/Q_{LED} = 2*10^{-3} \text{ m}^2/\text{W, for } k*t > 0.025 \text{ W/K} \qquad \text{EQ. 1}$$

This is the ratio of an area A, measured in m², to a thermal power of the LED, $Q_{LED}$, measured in watts. Thermal power of the LED is the waste heat power emitted by the LED, and does not include the power of its radiated light (UV or visible). A is the minimum thermal pad surface area per LED.

As noted, equation (1) is operable for the condition where $k*t > 0.025$ W/K, where k is the thermal conductivity of the thermal pad material (measured in W/m-K); and t is the thickness of the thermal pad conductive layer (measured in meter).

In accordance with another implementation, the minimum thermal pad surface area can be calculated by Equation 2:

$$A = \left[ \frac{\Delta T_{JS} - R_{JS} * Q_{LED} - C * Q_{LED}}{(k*t)^{-0.397} * A_{LED-PCB}^{-0.038} * C' * Q_{LED}} \right]^{-1.21}, \qquad \text{EQ. 2}$$

where C is an constant set at 14.75 K/W, and C' is another constant set at 0.05 $\text{m}^{1.72889}\text{K}^{0.603}\text{W}^{-0.603}$ In Equation (2), A is the minimum thermal pad surface area per LED (measured in m²); $\Delta T_{JS}$ is an acceptable temperature rise of the LED junction temperature compared to the solder (dimension: Kelvin); $R_{JS}$ is the solder-to-junction thermal resistance (dimension: K/W); $Q_{LED}$ is (as above) the thermal power generated by the LED (dimension: W); k is the thermal conductivity of the thermal pad material; t is the thickness of the thermal pad conductive layer; and $A_{LED-PCB}$ is the thermal contact surface area of a single LED (dimension: m²). Equation (2) was developed through use of a multi-parameter simulation, in which power functions were used to create a formula to calculate the minimum surface area.

The thermal pads 160 located between and/or surrounding the LED light sources spread the heat and, thus, reduces the heat flux at the boundary of the thermally conductive layer and the substrate of the PCB. Due to the reduced heat flux, the heat can go through the substrate material of the PCB and housing with an acceptable temperature drop, even if the housing and PCB substrate material have poor thermal property (heat conductivity less than 0.5 W/m-K (Watt/meter-Kelvin)). A portion of the heat may transfer through radiation and/or convection to the optical elements, from where it is dissipated towards the environment. The PCB is self-cooling and is structured to have a surface area and conductive layer thickness sufficient to dissipate heat generated by the plurality of LED light sources. As used herein the term "self-cool" has the meaning of the temperature drop between the LED solderpoint and the environment is below an acceptable limit even if the PCB is not attached to any luminaire or heat sink other than the thermal pads disclosed herein.

Figure 2:
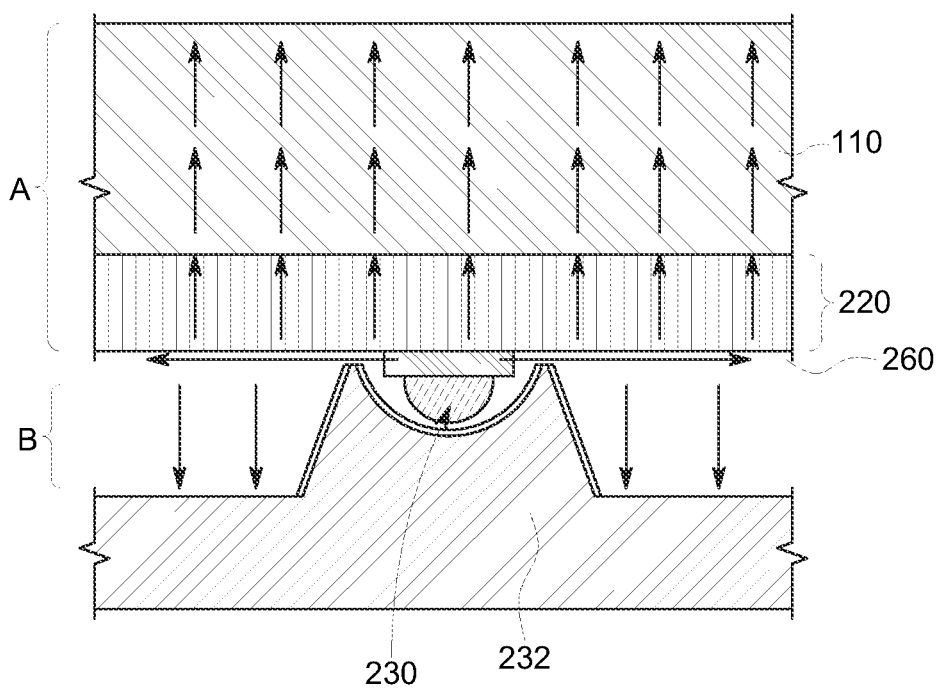
FIG. 2 depicts a close up of the LED luminaire of FIG. 1 showing one LED light source mounted on a PCB in accordance with some embodiments.

FIG. 2 depicts a close up of the LED luminaire of FIG. 1 showing single LED 230 and a portion of PCB 220 on which the LED is mounted in accordance with some embodiments. The PCB surface on which the LED light source is mounted includes thermal pads 260, which are etched from a conductive material clad to the PCB. LED light source 230 is enclosed by optical element 232 located proximal to the PCB surface having the LED light sources. Arrows A represent the thermal flow of heat conduction through thermal pad 260 and through the PCB substrate into housing 110. Arrows B represent the thermal radiation and convection in the direction of optical element 232.

In accordance with embodiments, parameters of the particular LED light sources installed on the PCB are considered in determining the thickness of the conductive layer used for the thermal pads, the conductive layer material's heat conductivity, and the specific surface area of the thermal pad of the luminaire. These considerations are based on selection for uniform temperature distribution over the PCB. The quantity of thermal pads is determined by the thermal capacity of one thermal pad (based on equation 1) and the number of LED light sources mounted to the PCB.

In accordance with embodiments, this arrangement results in lower temperature gradient towards the environment, enables the usage of low-heat conductive material for the housing of the LED luminaire and also for the PCB substrate, and maintaining a satisfactory junction temperature for the LEDs. Accordingly, there is no need for a heat-sink for the LED light sources. In accordance with embodiments, the plastic housing and/or the PCB substrate can be made from heat conductive material.

In accordance with implementations, the dimension of the thermal pads, their thickness, and thermal conductivity are chosen so that temperature distribution over the PCB is about uniform (e.g., the in-plane temperature gradient on the PCB surface is about less than 15° C./25 mm).

Further, the PCB is mounted in the luminaire so that there is a minimal air gap, or bubble, at the housing and PCB edge interface. Thus, reducing the thermal contact resistance between the two and minimizing the heat build-up at their junction. The spacing between the LED light sources is chosen so that the surface area per chip is able to dissipate the heat towards the environment with acceptable temperature rise. For example, for a luminaire plastic housing made from material having a λ of about or equal to 0.5 W/m-K heat conductivity, with a heat load per LED light source of 1.6 W, the thermal pad size would be about 55 mm square per LED light source. Thermal simulation results show that this arrangement results in lower temperature gradient towards the environment and enables the usage of low thermally conductive material in the housing of the LED luminaire and also in the substrate of PCB 120.

When outdoor lighting fixtures are being replaced, consideration is given to the payback period (i.e., the period of time needed to recoup the expense of the fixture). A lightweight, compact LED luminaire with conventional plastic housing in accordance with embodiments has a lower cost compared to existing designs. For the same performance, embodying LED luminaires would have a shorter payback period.

Additionally, embodying LED luminaires have no electromagnetic shielding effect on an internal antenna, which is a big advantage for implementing wireless communication and control features. Also, embodying LED luminaires are lighter weight, thus, reducing the costs of an associated light pole on which to mount the luminaire as compared to conventional fixtures.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A light emitting diode (LED) luminaire comprising:
a housing having two or more surfaces, the housing formed at least in part from a plastic material that is heat conductive;
a printed circuit board (PCB) coupled to at least one of the two or more surfaces;
the PCB including a substrate and a surface opposing the substrate;
the substrate in thermal contact with the at least one of the two or more surfaces;
a plurality of LED light sources mounted on the PCB opposing surface;
a conductive material on at least a portion of the PCB opposing surface;
a first portion of the conductive material forming conductive paths in electrical communication with the plurality of LED light sources;
a second portion of the conductive material forming thermal pads at a plurality of locations that are at least one of between and around the plurality of LED light sources, the thermal pads configured to dissipate heat generated by the plurality of LED light sources; and
at least a portion of the dissipated heat flowing through the thermal contact to the heat conductive plastic material of the housing.

2. The LED luminaire of claim 1, wherein the conductive material is both electrically and thermally conductive.

3. The LED luminaire of claim 1, wherein the conductive paths are electrically insulated from the thermal pads.

4. The LED luminaire of claim 1, wherein the conductive paths are electrically connected to the thermal pads.

5. The LED luminaire of claim 1, including electrical drive circuitry electrically connected to the conductive paths, the electrical drive circuitry providing power to the plurality of LED light sources.

6. The LED luminaire of claim 1, including an optical unit positioned proximal of the plurality of LED light sources.

7. The LED luminaire of claim 1, the thermal pads having a surface area sufficient to self-cool the PCB.

8. The LED luminaire of claim 7, wherein the thermal pad surface area is determined from one or more properties of the conductive material including thickness of the conductive material and heat conductivity properties of the conductive material.

9. The LED luminaire of claim 7, wherein a thermal pad surface area in square meters for one of the plurality of LED light sources is determined by the expression $A/Q_{LED} = 2*10^{-3}$ m²/W, for $k*t > 0.025$ W/K,
where $Q_{LED}$ is the thermal power generated by a single LED light source;
k is the thermal conductivity of the conductive material; and
t is the thickness of the conductive material.

10. The LED luminaire of claim 1, the housing comprising a non-thermally enhanced plastic material.

11. The LED luminaire of claim 10, wherein the non-thermally enhanced plastic material has a thermal conductivity of less than about 0.5 W/m-K.

12. The LED luminaire of claim 1, wherein the housing comprises a plastic material with enhanced thermal conductivity.

13. The LED luminaire of claim 12, wherein the plastic material with enhanced thermal conductivity has a thermal conductivity equal or greater than about 0.5 W/m-K.

14. The LED luminaire of claim 1, including the PCB is self-cooling and structured to have a surface area and a conductive layer thickness sufficient to dissipate the heat generated by the plurality of LED light sources.

15. The LED luminaire of claim 1, including the quantity of thermal pads determined by the thermal load of heat generated, where a thermal pad for one of the plurality of LED light sources has a surface area in square meters calculated by the expression $A/Q_{LED} = 2*10^{-3}$ m²/W, for $k*t > 0.025$ W/K,
where $Q_{LED}$ is the thermal power generated by a single LED light source;
k is the thermal conductivity of the conductive material; and
t is the thickness of the conductive material.

* * * * *